United States Patent
Cheng et al.

(10) Patent No.: US 11,177,214 B2
(45) Date of Patent: Nov. 16, 2021

(54) INTERCONNECTS WITH HYBRID METAL CONDUCTORS

(71) Applicant: International Business Machines Corporation, Armonk, NY (US)

(72) Inventors: Kenneth Chun Kuen Cheng, Albany, NY (US); Chanro Park, Clifton Park, NY (US); Koichi Motoyama, Clifton Park, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 14 days.

(21) Appl. No.: 16/743,247

(22) Filed: Jan. 15, 2020

(65) Prior Publication Data
US 2021/0217698 A1    Jul. 15, 2021

(51) Int. Cl.
*H01L 23/528* (2006.01)
*H01L 23/522* (2006.01)
*H01L 23/532* (2006.01)
*H01L 21/768* (2006.01)

(52) U.S. Cl.
CPC .... *H01L 23/5283* (2013.01); *H01L 21/76802* (2013.01); *H01L 21/76846* (2013.01); *H01L 21/76897* (2013.01); *H01L 23/5226* (2013.01); *H01L 23/53209* (2013.01); *H01L 23/53214* (2013.01); *H01L 23/53238* (2013.01); *H01L 23/53257* (2013.01)

(58) Field of Classification Search
CPC ............ H01L 23/5283; H01L 23/5226; H01L 23/53266; H01L 23/53238; H01L 23/53257; H01L 21/76802; H01L 23/53214
See application file for complete search history.

(56) References Cited

U.S. PATENT DOCUMENTS

| | | | |
|---|---|---|---|
| 7,867,891 | B2 | 1/2011 | O'Brien et al. |
| 9,324,650 | B2 | 4/2016 | Edelstein et al. |
| 9,806,023 | B1* | 10/2017 | Briggs .............. H01L 21/32134 |
| 9,911,690 | B2 | 3/2018 | Edelstein et al. |
| 9,953,865 | B1 | 4/2018 | Briggs et al. |
| 9,966,337 | B1 | 5/2018 | Briggs et al. |
| 10,128,188 | B2 | 11/2018 | Adusumilli et al. |
| 10,177,028 | B1 | 1/2019 | Licausi et al. |
| 10,242,909 | B2 | 3/2019 | Briggs et al. |

(Continued)

OTHER PUBLICATIONS

Briggs et al., "Fully aligned via integration for extendibility of interconnects to beyond the 7 nm node," International Electron Devices Meeting (IEDM), 2017, 14.2, 4 pages.

(Continued)

*Primary Examiner* — Phat X Cao
(74) *Attorney, Agent, or Firm* — Cantor Colburn LLP; L. Jeffrey Kelly (57) ABSTRACT

A back end of line interconnect structure and methods for forming the interconnect structure including a fully aligned via design generally includes wide lines formed of copper and narrow lines formed of an alternative metal. The fully aligned vias are fabricated using a metal recess approach and the hybrid metal conductors can be fabricated using a selective deposition approach.

8 Claims, 5 Drawing Sheets

(56) References Cited

U.S. PATENT DOCUMENTS

2007/0212870 A1\* 9/2007 Yang ................. H01L 21/76849
　　　　　　　　　　　　　　　　　　　　　　438/618
2017/0256449 A1\* 9/2017 Zhang ............... H01L 21/76882
2019/0088541 A1\* 3/2019 Licausi ............. H01L 21/76897

OTHER PUBLICATIONS

Fan et al., "Middle of line RC performance study at the 7 nm node," International Interconnect Technology Conference (IITC), 2017, 3 pages.
Wen et al., "Atomic layer deposition of ruthenium with TiN interface for sub-10 nm advanced interconnects beyond copper," ACS Applied Materials & Interfaces, vol. 8, No. 39, 2016, pp. 26119-26125 (7 pages).

\* cited by examiner

INTERCONNECTS WITH HYBRID METAL CONDUCTORS

BACKGROUND

The present invention is generally directed to semiconductor devices and methods of manufacturing the same, and more particularly, to methods and structures for fabricating interconnects with hybrid metal conductors.

Semiconductor structures are typically fabricated using multiple layers, which can include two or more patterned conductive layers separated by intervening insulation layers. Considering the layers to be horizontally stacked, vertical points of contact between the two or more conductive layers through the insulation layers are known as via structures, which provide a wiring pattern for the integrated circuit.

SUMMARY

Embodiments of the present invention are directed to structures and methods of fabricating a semiconductor device. In one or more embodiments of the invention, a back end of line interconnect structure includes at least one fully aligned via in a metallization level in electrical communication with a selected narrow metal line of an underlying metallization level. The underlying metallization level further includes one or more wide metal lines and one or more of the narrow metal lines in an interlayer dielectric layer. The wide metal lines have a width dimension that is two times to ten times a width dimension for the narrow metal lines. The narrow metal lines include a metal conductor other than copper and the wide metal lines include a copper conductor. Both the narrow metal lines and the wide metal lines are recessed relative to a top surface of the interlayer dielectric layer.

In one or more embodiments of the invention, a process for forming a fully aligned via to an underlying metallization level includes forming an underlying metallization level by patterning a first interlayer dielectric layer to form one or more narrow trenches and one or more wide trenches, wherein the wide trenches have a width dimension that is two times to ten times a width dimension for the narrow trenches. A barrier layer is conformally deposited onto the patterned interlayer dielectric. A first metal layer including a metal other than copper is conformally deposited onto the patterned dielectric to completely fill the narrow trenches to form narrow metal lines and form an overburden thereon and partially fill the wide trenches. A portion of the first metal layer is selectively removed to form a recess in the narrow metal lines relative to the first interlayer dielectric and completely remove the first metal from the wide trenches. A second metal layer including a metal other than copper is conformally deposited onto the patterned dielectric. A copper metal is deposited and forms an overburden thereon to completely fill the recess in the narrow metal lines and completely fill the wide trenches. A portion of the copper metal is removed to completely remove the copper metal from the recess above the narrow metal lines and form a recess in the copper metal in the wide trenches to form wide metal lines. Exposed surfaces of the barrier layer and the second metal layer are selectively removed from the recesses above the narrow and wide metal lines. A dielectric cap layer is conformally deposited and a second interlayer dielectric layer is deposited on the dielectric cap layer. A fully aligned via opening is formed in the second interlayer dielectric to at least one of the narrow metal lines in the underlying metallization level and filled with a metal conductor to form a fully aligned via in electrical communication with the narrow metal line.

In one or more embodiments of the invention, a process of forming fully aligned dual damascene interconnects with hybrid metal conductors includes forming a set of recesses for each one or more narrow lines or wide lines in a top surface of a first interlayer dielectric. The wide lines have a width dimension that is two times to ten times a width dimension for the narrow lines. The narrow lines include a metal conductor other than copper and the wide lines include copper and a metal conductor other than copper between the first interlayer dielectric and the copper. A dielectric cap layer is conformally deposited and second interlayer dielectric layer is deposited on the dielectric cap layer. A fully aligned via in the second interlayer dielectric is formed to at least one of the narrow lines and is in electrical communication therewith.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

As the number of transistors in an integrated circuit continues to increase, copper-based dual damascene interconnects scale smaller in dimension and are more closely packed. In this type of process, via openings and trenches are formed in an interlayer dielectric prior to the deposition of metal materials. The via openings typically have a tapered edge with a smaller cross-sectional area (width) at the bottom of the opening than at a top of the opening. Consequently, increases in line and via resistance can occur as well as a higher likelihood of misalignment induced leakage and/or shorting. For example, due to scaling, via resistance has been increasing by greater than 2× the rate of wires (i.e., lines).

Aspects of the present invention are generally directed to methods and structures for fabricating fully aligned vias with hybrid metal conductors. Relatively narrow lines are selected to be filled with an alternative metal such as ruthenium whereas wider lines are filled with copper. The hybrid metal conductor interconnect structures provide lower resistance at the narrow lines without compromising resistance at the wider lines. Moreover, fully aligned via design can ensure that the vias are far apart from neighboring lines to maintain a consistent breakdown voltage and minimize any leakage or short.

Prior art processes attempt to achieve hybrid metallization by depositing alternative metals in the narrow and wide trench features until the narrow trench features are completely filled, which creates a relatively thick liner of the alternative metal in the wide trench features. The process then includes etching to thin down the relatively thick metal line and remove overburden on the narrow trenches. The wide trenches are then filled with copper. The problem with these types of processes is the relatively small process window with respect to the etching step. Under-etch results in a thick liner whereas over-etch results in a metal recess in the narrow lines.

Embodiments of the present invention provide a robust process window and generally include an intentional over-etch to provide recessed metal lines in the narrow trenches and a thin conformal metal liner remaining in the wide trenches that define the wide lines. Dual damascene fully aligned vias can then be fabricated to the recessed metal lines. As used herein, reference to narrow and wide lines or trenches that define the line generally refers to the wide lines/trenches having a linewidth dimension that is two times to ten times the narrow linewidth dimension. A thin conformal layer of the alternative metal is then deposited in the recesses of the narrow lines and on the liner layer in the wide trenches. Copper is then deposited to form an overburden thereon filling both the narrow and wide trench features. Subsequent to planarization, the copper is selectively removed by an etch process from the recesses in the narrow lines, which also forms a recess in the wide lines. The exposed alternative metal is then selectively removed by an etch process from the sidewalls of the narrow and wide lines. A dielectric capping layer and a second interlayer dielectric are then deposited, which are then subjected to a dual damascene process to form one or more fully aligned vias to the recessed narrow lines.

Advantageously, lower resistance is provided at the narrow lines without compromising resistance at the wide lines. Moreover, a fully aligned via design ensures that the vias are far apart from neighboring lines to maintain a consistent break down voltage and to minimize any leakage and/or short. Still further, a much larger process window is achieved by intentionally overreaching compared to the prior art.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in embodiments of the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

Figure 1:
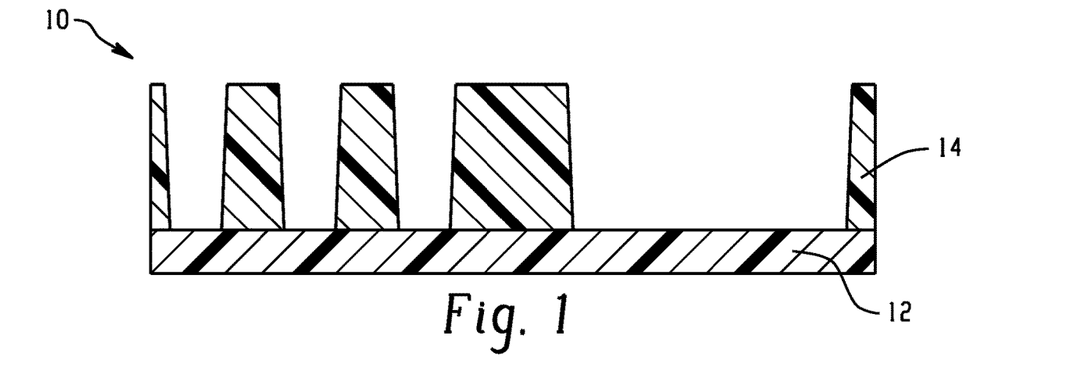
FIG. 1 is a cross-sectional view of patterned interlayer dielectric layer including narrow and wide trench features according to embodiments of the invention.

Turning now to a more detailed description of aspects of the present invention, FIG. 1 depicts a cross-sectional view of a semiconductor structure 10 including an underlying layer 12, and a patterned dielectric layer 14 (i.e., first interlayer dielectric) on the underlying layer 12. The patterned dielectric layer includes a plurality of trenches, e.g., both narrow trenches and wide trenches. As noted above, the terms "narrow" and "wide" when used in the context of trenches or lines refers to a width dimension, wherein the wide trenches or lines are two times to ten times the width dimension of the narrow trenches or lines. As shown in FIG. 1, there are three narrow trench features and one wide trench feature formed in the patterned dielectric layer although lesser or greater numbers are contemplated.

The patterned dielectric layer 14 can be formed using conventional lithography and etching process. The lithographic step typically includes applying a photoresist to the surface of the dielectric layer 12, exposing the photoresist to a desired pattern of radiation, and developing the exposed resist utilizing a conventional resist developer to form a pattern. The etching process can be a dry etching or wet etching process. The term "wet etching" generally refers to application of a chemical solution. The term "dry etching" is used here to denote an etching technique such as reactive-ion-etching (RIE), ion beam etching, plasma etching or laser ablation. During the etching process, the photoresist pattern is first transferred to the dielectric layer. The patterned photoresist is typically, but not necessarily, removed from the structure after the pattern has been transferred into the dielectric film.

The patterned dielectric layer 12 can be formed of any dielectric material although low-k dielectric materials are preferred. Suitable dielectric materials include carbon-doped silicon dioxide materials: fluorinated silicate glass (FSG); organic polymeric thermoset materials, silicon oxycarbide; SiCOH dielectrics; SiNCH dielectrics, fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). Other suitable dielectric materials include organic polymeric thermoset materials, consisting essentially of carbon, oxygen and hydrogen, including the low-k polyarylene ether polymeric material known as SiLK™ (available from The Dow Chemical Company), and the low-k polymeric material known as FLARE™ (available from Honeywell).

The underlying layer 12 is not intended to be limited and can include a device layer, for example, a layer containing transistors, capacitors, resistors, electrodes and the like, or an interconnect layer, or the like.

Figure 2:
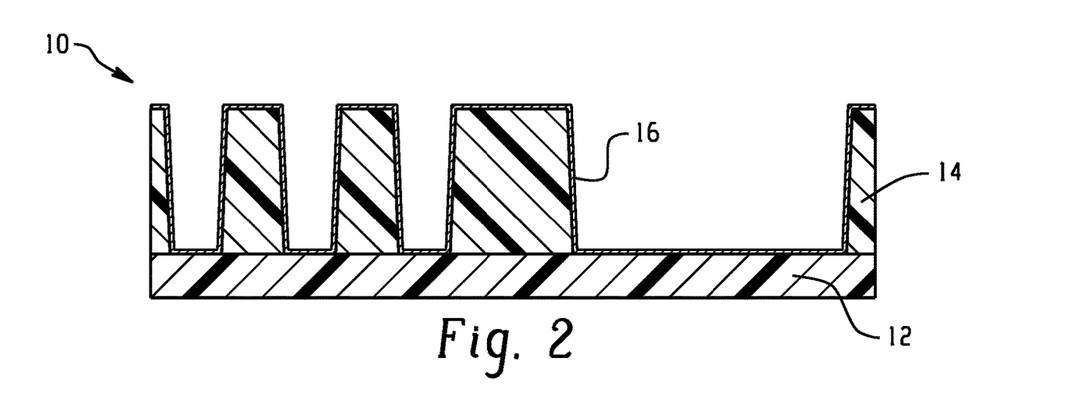
FIG. 2 depicts a cross-sectional view of FIG. 1 subsequent to conformal deposition of a barrier layer according to embodiments of the invention.

FIG. 2 depicts a cross sectional view of the structure of FIG. 1 subsequent to conformal deposition of a barrier layer 16. Typical metals utilized for the barrier layer include titanium, titanium nitride, tantalum, tantalum nitride, ruthenium, ruthenium nitride, cobalt, cobalt nitride, or combinations thereof or the like. The barrier metal layer can have a thickness of about 10 Angstroms (Å) to about 500 Å. In one or more embodiments, the thickness can be from about 20 Å to about 300 Å, and in still one or more embodiments, the thickness came from 30 Å to about 200 Å. The barrier metal layers can be deposited by plasma vapor deposition.

Figure 3:
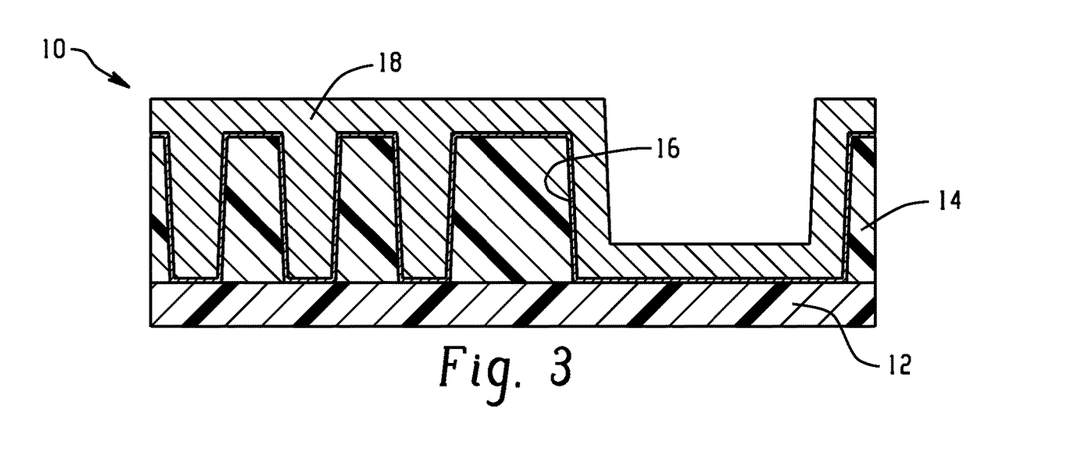
FIG. 3 depicts a cross-sectional view of FIG. 2 subsequent to conformal deposition of an alternative metal layer filling the narrow trench features and partially filling the wide trench features according to embodiments of the invention.

FIG. 3 depicts a cross sectional view of the structure of FIG. 2 subsequent to conformal deposition of a first alternative metal conductor 18. Reference to "alternative metal" refers to a metal conductor other than copper. Exemplary alternative metals include, but are not limited to, aluminum, ruthenium, cobalt, rhodium, iridium, nickel, or alloys thereof or the like as desired for the application. Deposition of the metal 18 can be provided by CVD, sputtering, electrochemical deposition or like processes. The deposition of the alternative metal is at a thickness effective to completely fill the narrow trenches and form an overburden thereon whereas the wide trench is partially filled as shown.

Figure 4:
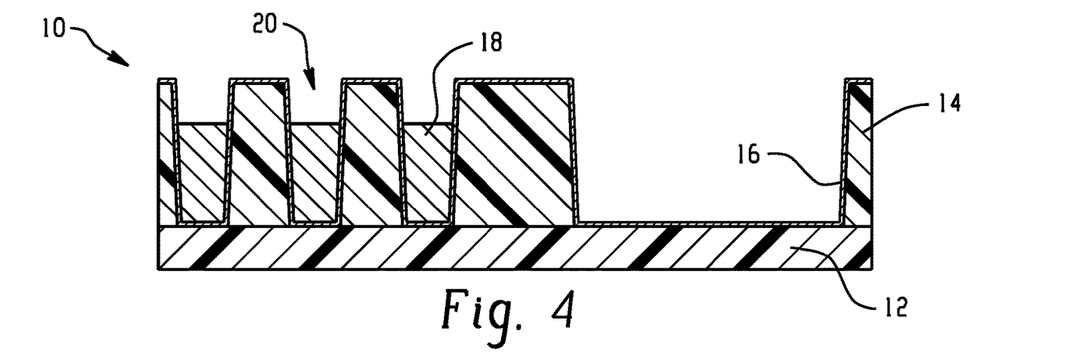
FIG. 4 depicts a cross-sectional view of FIG. 3 subsequent according to selective removal of a portion of the alternative metal layer to the barrier layer of the wide trench features to form recesses therein according to embodiments of the invention.

FIG. 4 depicts a cross sectional view of the structure of FIG. 3 subsequent to selectively etching the alternative metal 18 to the barrier layer 16 in the wide trench. Selective etching in this manner forms a recess 20 in the narrow trenches. For example, selective etch of ruthenium can include wet etching using a chemical composition having an oxidizer, wherein the chemical composition is buffered to include a pH greater than 7.

The oxidizer can include periodic acid, potassium periodate, sodium periodate; the buffer agent can include boric acid and the pH adjusting agent can include, potassium hydroxide, sodium hydroxide, and/or lithium hydroxide. The wet etch process can be employed at room temperature, although elevated temperatures up to about 65° C. can also be employed. The wet etch process selectively removes Ru without removing the metal barrier layer 16. In doing so, the narrow trench sidewalls defined by the recess 20 are free from the alternative metal yet still maintains the barrier layer. With regard to the wide trenches, as noted above the selective etch process completely removes the alternative metal to the barrier layer 16.

Figure 5:
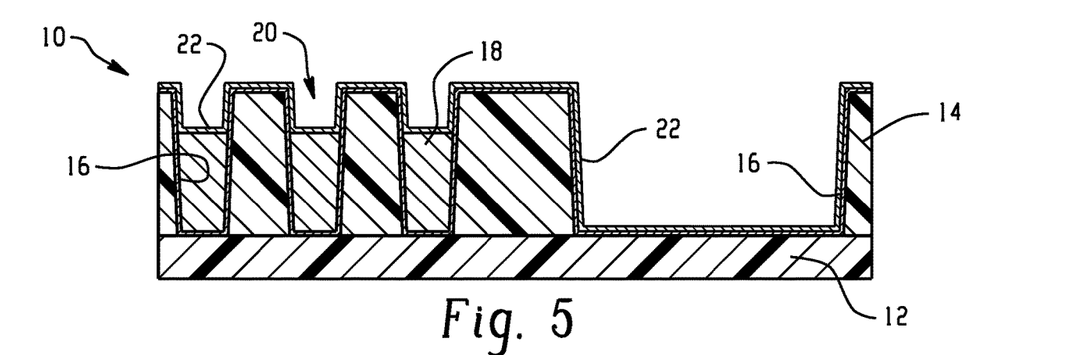
FIG. 5 depicts a cross-sectional view of FIG. 4 subsequent to conformal deposition of a second alternative metal layer according to embodiments of the invention.

FIG. 5 depicts a cross sectional view of the structure of FIG. 4 subsequent to conformal deposition of a thin layer of a second alternative metal 22 such that the recess 20 remains in the narrow trenches. The second alternative metal 22 can be the same as the first alternative metal 18 or can be a different metal.

Figure 6:
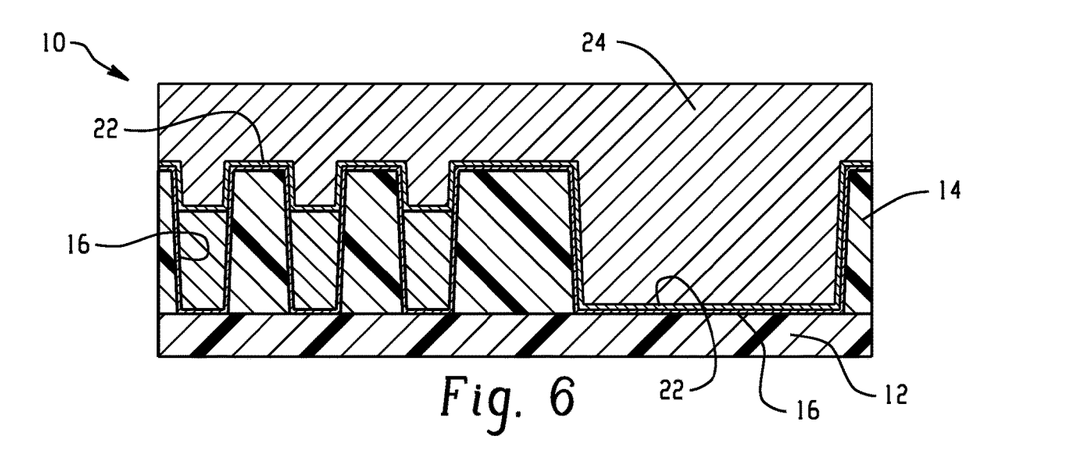
FIG. 6 depicts a cross-sectional view of FIG. 5 subsequent to deposition of a copper layer forming an overburden thereon according to embodiments of the invention.

FIG. 6 depicts a cross sectional view of the structure of FIG. 5 subsequent to deposition of copper layer 24. Optionally, a conformal seed layer (not shown) can first be deposited. The function of the seed layer is to provide a base upon which the copper conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

In some structures, the copper metal layer 24 can include an alloying element such as C, N, O, Cl or S, which has been shown to improve the reliability of the copper conductor. The amount of alloying element in the copper alloy is typically in the range of about 0.001 weight percent (wt. %) to about 10 wt %). The copper layer 24 can be formed by CVD, sputtering, electrochemical deposition or like processes. For example, the deposition of copper can proceed by electrochemical deposition such as electroplating or electroless plating.

Figure 7:
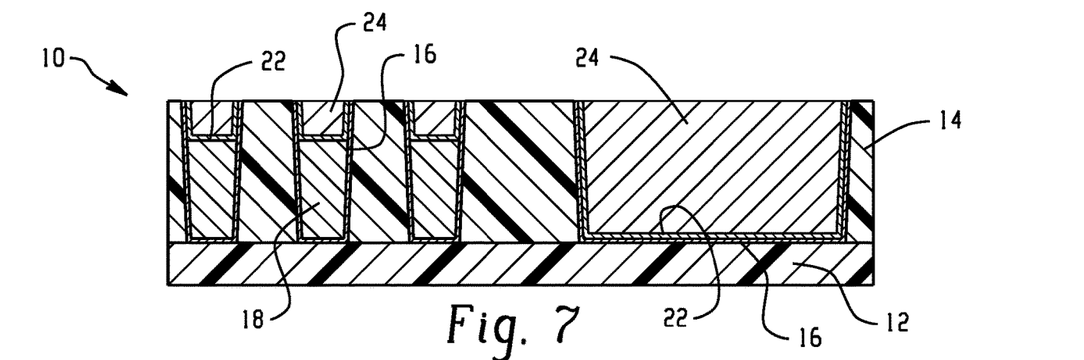
FIG. 7 depicts a cross-sectional view of FIG. 6 subsequent to planarization to the interlayer dielectric according to embodiments of the invention.

FIG. 7 depicts a cross sectional view of the structure of FIG. 6 subsequent to a planarization process such as chemical mechanical planarization (CMP). The CMP process planarizes the surface by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry. The planarization process stops at the dielectric layer 14.

Figure 8:
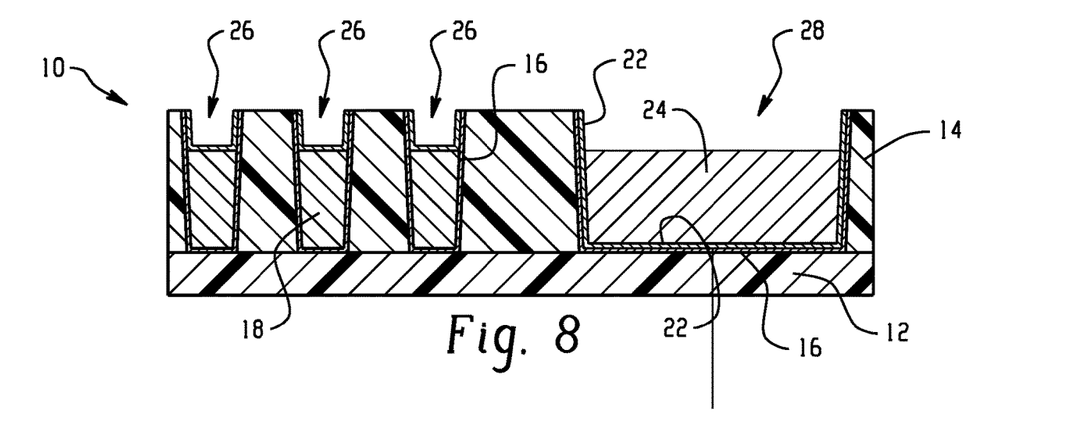
FIG. 8 depicts a cross-sectional view of FIG. 7 subsequent to selective removal of a portion of the copper to completely remove the copper from the narrow trench features and partially remove the copper from the wide trench features according to embodiments of the invention.

FIG. 8 depicts a cross sectional view of the structure of FIG. 7 subsequent to selective etching of the copper 24 to the alternative metal layer 18 in the narrow trenches, which forms recess 26 in the narrow trenches and recess 28 in the wide trench. Consequently, the narrow trenches are partially filled with the alternative metal 18 and include the barrier layer 16 on the bottom and sidewall surfaces of the narrow trenches and further includes the second alternative metal 22 along sidewalls defined by the recess 26. The wide trench is partially filled with the copper layer 24 and further includes the barrier layer 16 and the second alternative metal 22 along sidewalls/bottom surface of the wide trench. The copper layer 24 can be selectively removed using a dry or wet etch without damaging the alternative metal layer 22, which are known in the art. For example, an exemplary etching solution includes solutions containing diamine (e.g., ethylenediamine) and/or triamine (e.g., diethylenetriamine) as biand ternary complexing agents, respectively, and hydrogen peroxide as the oxidizing agent. In some embodiments, the etching solution further includes a pH adjusting agent such as sulfuric acid, amino acid, and carboxylic acid.

Figure 9:
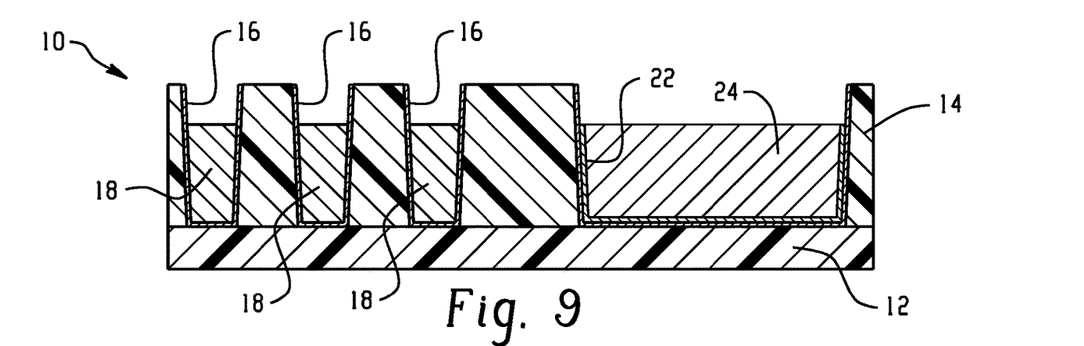
FIG. 9 depicts a cross-sectional view of FIG. 8 subsequent to selective removal to the interlayer dielectric of exposed surfaces of the alternative metal layer of according to embodiments of the invention.

FIG. 9 depicts a cross sectional view of the structure of FIG. 8 subsequent to selective removal of the second alternative metal 22 from the sidewalls defined by the recesses 26, 28. For example, selective etch of ruthenium can include wet etching using a chemical composition having an oxidizer, wherein the chemical composition is buffered to include a pH greater than 7 as previously described.

Figure 10:
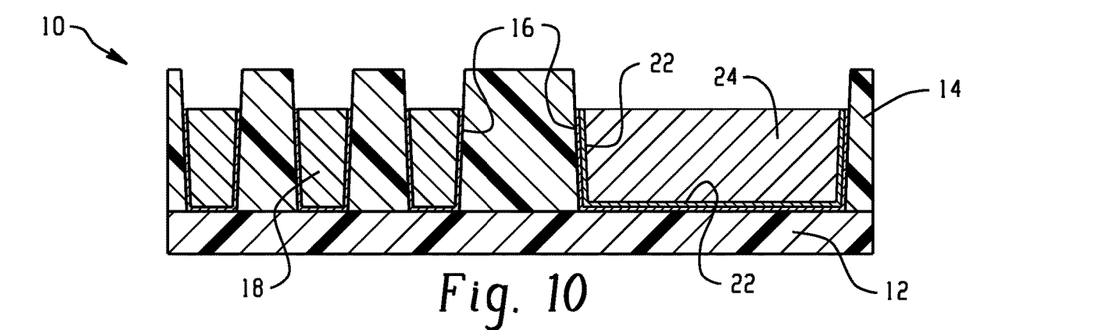
FIG. 10 depicts a cross-sectional view of FIG. 9 subsequent to subsequent to selective removal of the exposed barrier layer from sidewall surfaces of the narrow and wide trench features according to embodiments of the invention.

FIG. 10 depicts a cross sectional view of the structure of FIG. 9 subsequent to selective removal of the barrier layer from the sidewalls defined by recesses 26, 28 with respect to copper, alternative metals such as ruthenium or the like, and dielectric materials. By way of example, tantalum nitride can be removed using an etchant composition including a compound selected from group consisting of -azole, -triazole, and combinations thereof; a compound containing one or more peroxy groups; one or more alkaline metal hydroxides; and water. According to embodiments of the present invention, the barrier layer is selectively etched using, for example, 15% $H_2O_2$ (hydrogen peroxide)+10 g/L (grams/liter) BTA (Benzotriazole)+0.5 g/L CDTA (cyclohexanediamininetetraaceticacid)+KOH (potassium hydroxide) in deionized (DI) water at a pH in the range of about 4 to about 12. Etching can be performed at temperatures ranging from about 25° C. to about 70° C. Other possible variations for etch chemistry include, but are not necessarily limited to: (a) replacing KOH by another alkaline metal hydroxide, such as, for example, one of LiOH, NaOH, RbOH, CsOH, and combinations thereof, at concentration ranges of about 0.001M to about 0.1M (molar); (b) replacing hydrogen peroxide by another compound containing one or more peroxy groups, such as, for example, one of perborate salts, percarbonate, urea-hydrogen peroxide, and combinations thereof, at concentration ranges of about 1% to about 20%; (c) replacing CDTA by another peroxide stabilizer, such as, for example, one of diethylenetriaminepenta(methylenephosphonic acid) (DTPMPA), and ethylenediaminetetraacetic acid (EDTA) at concentration ranges of about 0.1 g/L to about 1 g/L; and (d) replacing BTA by another corrosion inhibitor, such as, for example, one of 1,2,3 triazole, 1,3,4 triazole, 1,2,4 triazole, imidazole, methyl-thiol-triazole, thiol-triazole, triazole acid, 5-methyl-1H-benzotriazole, at concentration ranges of about 0.1 g/L to about 10 g/L.

Figure 11:
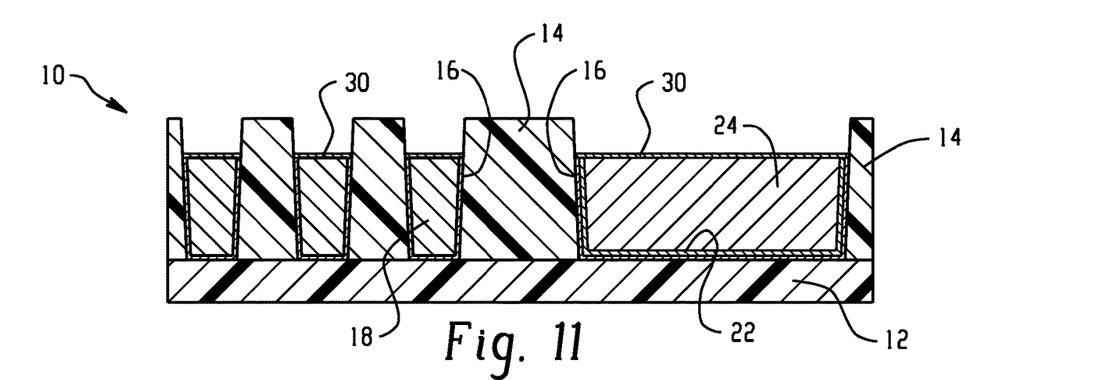
FIG. 11 depicts a cross-sectional view of FIG. 10 subsequent to optional deposition of a metal cap layer on an exposed surface of the copper in the wide trench features according to embodiments of the invention.

FIG. 11 depicts a cross sectional view of the structure of FIG. 10 subsequent to an optional selective metal cap layer 30 onto the exposed metal surfaces in both the narrow and wide trenches. The metal cap layer can be titanium, titanium nitride, tantalum, tantalum nitride, ruthenium, ruthenium nitride, cobalt, cobalt nitride, or combinations thereof or the like.

Figure 12:
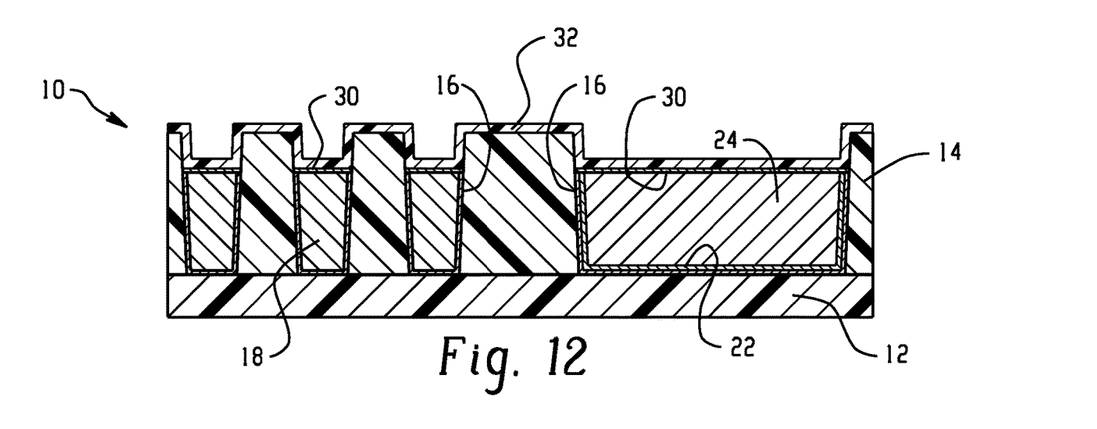
FIG. 12 depicts a cross-sectional view of FIG. 11 subsequent to conformal deposition of a dielectric cap layer according to embodiments of the invention.

FIG. 12 depicts a cross sectional view of the structure of FIG. 11 subsequent to conformal deposition of a dielectric cap layer 32. The dielectric cap layer is not intended to be limited and can include aluminum oxide, SiCN, SiC, and the like. The dielectric cap layer can be conformally deposited using atomic layer deposition, for example.

Figure 13:
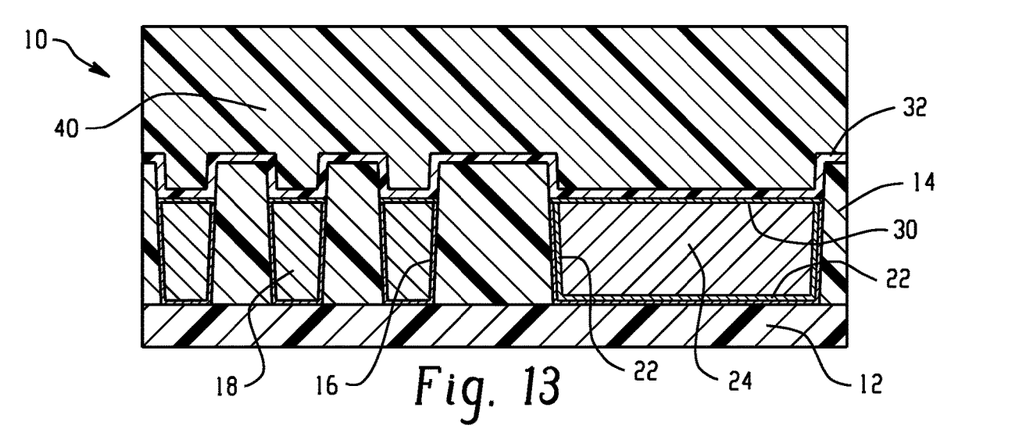
FIG. 13 depicts a cross-sectional view of FIG. 12 subsequent to deposition of a second interlayer dielectric according to embodiments of the invention.

FIG. 13 depicts a cross sectional view of the structure of FIG. 12 subsequent to deposition of a second interlayer dielectric layer 40 onto the dielectric cap layer 32. Suitable dielectric materials include carbon-doped silicon dioxide materials; fluorinated silicate glass (FSG); organic polymeric thermoset materials, silicon oxycarbide; SiCOH dielectrics; SiNCH dielectrics, fluorine doped silicon oxide:

spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell). JSR 5109 and 5108 (available from Japan Synthetic Rubber), Zirkon™ (available from Shipley Microelectronics, a division of Rohm and Haas), and porous low-k (ELk materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). Other suitable dielectric materials include organic polymeric thermoset materials, consisting essentially of carbon, oxygen and hydrogen.

Figure 14:
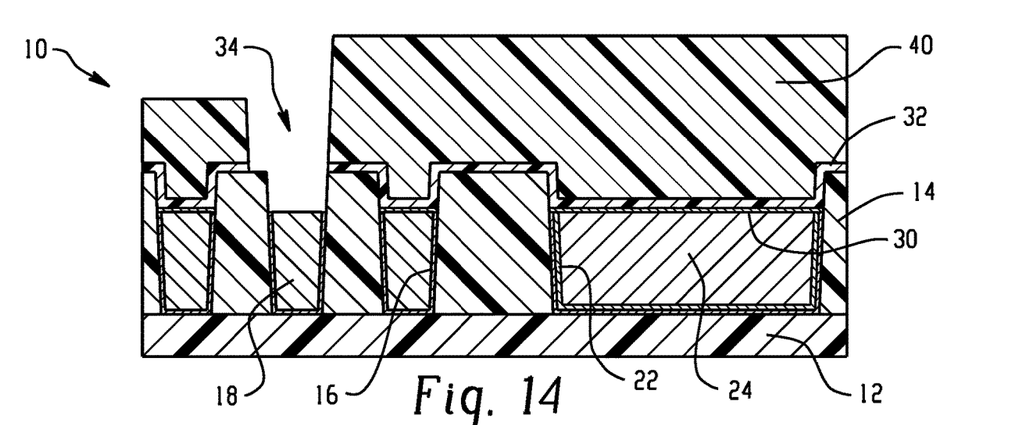
FIG. 14 depicts a cross-sectional view of FIG. 13 subsequent to dual damascene processing of the second interlayer dielectric to form a via opening to one or more of the narrow lines according to embodiments of the invention.

FIG. 14 depicts a cross sectional view of the structure of FIG. 13 subsequent to dual damascene processing of the second interlayer dielectric 40 including formation of a fully-aligned via opening 34 to expose the recessed alternative metal 18 of at least one of the alternative metal-filled narrow trenches i.e., a metal recessed narrow line.

Figure 15:
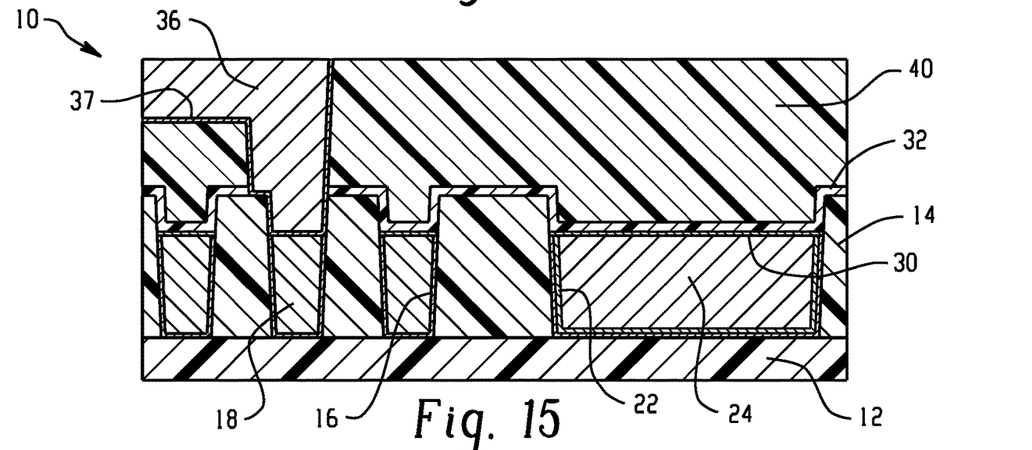
FIG. 15 depicts a cross-sectional view of FIG. 14 subsequent to filling the via opening with a metal conductor according to embodiments of the invention.

FIG. 15 depicts a cross sectional view of the structure of FIG. 14 subsequent to metal fill of a metal 36 in the via opening to form a fully aligned via to the recessed alternative metal of the narrow line. An optional barrier layer 37 similar to barrier layer 18 discussed above can be conformally deposited into the opening 34 prior to metal fill. Advantageously, the resulting hybrid interconnect dual damascene structures of the interconnects include a fully aligned via design with the wide lines filled with copper and the narrow lines filled with alternative metals, which can include, excluding copper, aluminum, ruthenium, cobalt, rhodium, iridium, nickel, or alloys thereof or the like as desired for the application.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A process for forming a fully aligned via to an underlying metallization level comprising:
   forming an underlying metallization level by patterning a first interlayer dielectric layer to form one or more narrow trenches and one or more wide trenches, wherein the wide trenches have a width dimension that is two times to ten times a width dimension for the narrow trenches;
   conformally depositing a barrier layer onto the patterned interlayer dielectric;
   conformally depositing a first metal layer comprising a metal other than copper onto the patterned dielectric to completely fill the narrow trenches to form narrow metal lines and form an overburden thereon and partially fill the wide trenches;
   selectively removing a portion of the first metal layer to form a recess in the narrow metal lines relative to the first interlayer dielectric and completely remove the first metal from the wide trenches;
   conformally depositing a second metal layer comprising a metal other than copper onto the patterned dielectric;
   depositing a copper metal and forming an overburden thereon to completely fill the recess in the narrow metal lines and completely fill the wide trenches;
   removing a portion of the copper metal to completely remove the copper metal from the recess above the narrow metal lines and form a recess in the copper metal in the wide trenches to form wide metal lines;
   selectively removing exposed surfaces of the barrier layer and the second metal layer from the recesses above the narrow and wide metal lines;
   conformally depositing a dielectric cap layer;
   depositing a second interlayer dielectric layer on the dielectric cap layer;
   forming a fully aligned via opening in the second interlayer dielectric to at least one of the narrow metal lines in the underlying metallization level; and
   filling the fully aligned via opening with a metal conductor to form a fully aligned via in electrical communication with the narrow metal line.

2. The process of claim 1 further comprising selectively depositing a metal cap layer onto a top surface of the copper metal prior to conformally depositing the dielectric cap layer, wherein the metal cap layer comprises a metal other than copper.

3. The process of claim 1, wherein the barrier layer comprises titanium, titanium nitride, tantalum, tantalum nitride, ruthenium, ruthenium nitride, cobalt, cobalt nitride, or combinations thereof.

4. The process of claim 1, wherein the first and second metal layers comprise aluminum, ruthenium, cobalt, rhodium, iridium, nickel, combinations thereof, or alloys thereof.

5. The process of claim 1, wherein selectively removing exposed surfaces of the barrier layer comprises exposing the exposed surfaces to an etchant composition comprising a compound selected from group consisting of -azole, -triazole, and combinations thereof; a compound containing one or more peroxy groups; one or more alkaline metal hydroxides; and water.

6. The process of claim 1, wherein selectively removing the portion of the first metal layer comprises exposing the first metal layer to a chemical composition comprising an oxidizer, wherein the chemical composition is buffered to include a pH greater than about 7.

7. The process of claim 1, wherein the conformal dielectric cap layer comprises SiCN, SiC, or aluminum oxide.

8. The process of claim 1, wherein the first and second metal layers comprise different metals.

* * * * *